(12) United States Patent
Jeon et al.

(10) Patent No.: US 7,619,430 B2
(45) Date of Patent: Nov. 17, 2009

(54) ELECTRICAL TESTING PROBE ASSEMBLY HAVING NONPARALLEL FACING SURFACES AND SLOTS FORMED THEREON FOR RECEIVING PROBES

(75) Inventors: Byung-Hee Jeon, Seongnam-si (KR); Dae-Cheol Kang, Namyangju-si (KR)

(73) Assignee: Nictech Co., Ltd., Seoul (KR)

( * ) Notice: Subject to any disclaimer, the term of this patent is extended or adjusted under 35 U.S.C. 154(b) by 0 days.

(21) Appl. No.: 12/139,330

(22) Filed: Jun. 13, 2008

(65) Prior Publication Data
US 2008/0309362 A1 Dec. 18, 2008

(30) Foreign Application Priority Data
Jun. 15, 2007 (KR) ............ 10-2007-0059161
Jun. 15, 2007 (KR) ............ 10-2007-0059164

(51) Int. Cl.
*G01R 31/02* (2006.01)
(52) U.S. Cl. .................. 324/762; 324/754
(58) Field of Classification Search ............. None
See application file for complete search history.

(56) References Cited

U.S. PATENT DOCUMENTS

| | | | |
|---|---|---|---|
| 3,702,439 A | 11/1972 | McGahey et al. | |
| 3,867,698 A * | 2/1975 | Beltz et al. | 324/762 |
| 4,965,865 A | 10/1990 | Trenary | |
| 5,670,889 A * | 9/1997 | Okubo et al. | 324/760 |
| 5,923,178 A * | 7/1999 | Higgins et al. | 324/754 |
| 6,040,704 A | 3/2000 | Kondo et al. | |
| 6,906,543 B2 * | 6/2005 | Lou et al. | 324/754 |
| 7,138,812 B2 | 11/2006 | Park et al. | |
| 7,150,095 B2 | 12/2006 | Ono et al. | |
| 2008/0174326 A1 | 7/2008 | Jeon et al. | |

FOREIGN PATENT DOCUMENTS

| | | |
|---|---|---|
| KR | 10-2004-0053235 A | 6/2004 |
| KR | 10-2006-0016827 A | 2/2006 |
| KR | 10-2006-0100695 A | 9/2006 |
| KR | 10-2006-0111392 A | 10/2006 |
| KR | 10-0747653 B1 | 8/2007 |
| KR | 10-0776985 B1 | 11/2007 |

* cited by examiner

*Primary Examiner*—Minh N Tang
(74) *Attorney, Agent, or Firm*—Knobbe Martens Olson & Bear LLP (57) ABSTRACT

Disclosed is a probe assembly for use in electrical testing of a test object. The probe assembly has a probe supporter body elongated in a first direction. The probe supporter has a first side surface, a second side surface, a first facing surface and a second facing surface. The first and second facing surfaces are configured to face a test object, and substantially nonparallel to each other. The probe assembly has a plurality of first slots formed on the first side surface and the first facing surface and a plurality of second slots formed on the second side surface and the second facing surface. Each slot is configured to receive a portion of a probe.

13 Claims, 7 Drawing Sheets

ELECTRICAL TESTING PROBE ASSEMBLY HAVING NONPARALLEL FACING SURFACES AND SLOTS FORMED THEREON FOR RECEIVING PROBES

CROSS-REFERENCE TO RELATED PATENT APPLICATIONS

This application claims priority to and the benefit of Korean Patent Application Nos. 10-2007-0059161 and 10-2007-0059164, both filed Jun. 15, 2007, the disclosures of which are incorporated herein by reference in its entirety.

BACKGROUND

1. Field

The present disclosure relates to a probe card and, more particularly, to a probe assembly for use in testing electrical characteristics of a testing object such as a semiconductor wafer, a flat panel display.

2. Description of the Related Technology

Semiconductor devices are manufactured through a variety of processes including wafer production, wafer test, die packaging and so forth. The wafer test refers to a so-called electrical die sorting test for testing electrical characteristics of the semiconductor devices. In the electrical die sorting test, the semiconductor devices are sorted into acceptable products and unacceptable products by bringing probe pins of a probe card into contact with electrode pads of the semiconductor devices and then allowing an electric current to flow through the electrode pads of the semiconductor devices. In addition to testing the semiconductor devices, the probe card is used in testing data/gate lines in a cell process of flat displays such as a TFT-LCD (Thin Film Transistor-Liquid Crystal Display), a PDP (Plasma Display Panel), an OEL (Organic Electro-Luminescence) and the like.

U.S. Pat. Nos. 7,150,095 and 7,138,812 disclose probe cards in which needle type probes are connected to a printed circuit board. Each of the probe cards disclosed in these patent documents includes a supporter for supporting probes on a printed circuit board. The probes are fixed to the supporter by means of an insulating material and electrically connected to the printed circuit board by soldering.

With the probe cards disclosed in the above patent documents, however, the probes need to be aligned with the supporter through the use of a probe-positioning jig in order for a worker to fix the probes to the supporter, and the soldering has to be performed to bond the probes to the printed circuit board. This sharply reduces the productivity of the probe cards and makes it quite difficult to evenly align the probes to the supporter.

Furthermore, the probe cards make it difficult to repair or replace the probes on a one-by-one basis because the probes are soldered to the printed circuit board. In other words, when one of the probes is defective, it is impossible to remove only the defective probe. There is no choice but to replace the probe card having the defective probe as a whole.

Moreover, in the probe cards, the probes are coated with an insulating material in order to prevent short-circuit of the probes, which leads to increased production cost and reduced productivity.

In recent years, the diameter of a wafer tends to be increased to 200 mm or more in an effort to improve the yield rate of semiconductor chips. Furthermore, the pattern of a wafer grows finer and finer. For these reasons, it is necessary to perform touchdown of a probe card several times while a single sheet of wafer is inspected with the probe card. Increase in the frequency of touchdown of a probe card leads to prolonged inspection time and rapid wear and damage of probes, thereby shortening the lifespan of the probe card.

The foregoing discussion is to provide general background information, and does not constitute an admission of prior art.

SUMMARY

One aspect of the invention provide a probe assembly for use in electrical testing of an object, which comprises: a probe supporter body elongated in a first direction and comprising a first side surface, a second side surface, a first facing surface and a second facing surface, wherein the first and second facing surfaces are configured to face a testing object, wherein the first and second facing surfaces are substantially nonparallel to each other; a plurality of first slots formed on the first side surface and the first facing surface, wherein each first slot is configured to receive a portion of a probe; a plurality of second slots formed on the second side surface and the second facing surface, wherein each second slot is configured to receive a portion of a probe.

In the foregoing assembly, the probe supporter body may have a cross-section having a generally gable shape. The first facing surface and the first side surface form a first angle therebetween, wherein the second facing surface and the second side surface form a second angle therebetween, and wherein the first and second angle may be about the same. Each first slot may comprise a portion extending in a second direction that is substantially perpendicular to the first direction, wherein each second slot may comprise a portion extending in the second direction. Each first slot may comprise a portion extending in a third direction that is substantially perpendicular to the first direction and substantially slanted relative to the second direction, wherein each second slot may comprise a portion extending in a fourth second direction that is substantially perpendicular to the first direction and substantially slanted relative to the second direction, wherein the third direction is not parallel to the fourth direction.

Still in the foregoing assembly, the probe assembly may comprise one of the plurality of first slots which does not overlap any one of the plurality of second slots when viewed in a direction perpendicular to the first side surface. The probe assembly may comprise one of the plurality of first slots, which has a width that partially overlaps with a width of one of the plurality of second slots when viewed in a direction perpendicular to the first side surface. The probe assembly may comprise one of the plurality of first slots that substantially eclipses one of the plurality of second slots when viewed in a direction perpendicular to the first side surface. The first and second side surfaces may be substantially parallel to each other. The first facing surface may be substantially slanted with respect to the first side surface.

Further in the foregoing assembly, the probe assembly may further comprise a first probe engaged with one of the plurality of first slots, and a second probe engaged with one of the plurality of second slots. The first probe may comprise a first arm generally extending in a second direction perpendicular to the first direction, wherein a portion of the first arm is inserted in the one of the plurality of first slots, a second arm electrically and physically connected to the first arm and generally extending in a third direction substantially perpendicular to the first direction and substantially slanted with respect to the second direction, wherein a portion of the second arm is inserted in the one of the plurality of first slots, a first terminal portion formed at a distal end of the first arm and comprising a first tip configured to contact a first electrode, and a second terminal portion formed at a distal end of the second arm and comprising a second tip configured to contact a second electrode.

Still further in the foregoing assembly, the probe assembly may further comprise a probe engaged with one of the plurality of first slots, and may further comprise a channel generally extending in the first direction and disposed between the first facing surface and the second facing surface, wherein the probe may comprise a projection projecting into the channel and further configured to limit the probe's movement in a direction perpendicular to the first side surface. The probe assembly may further comprise an additional facing surface which is substantially parallel to the first facing surface, wherein the channel is located between the first facing surface and the additional facing surface, and an additional slot formed on the additional facing surface configured to receive a portion of the probe.

Another aspect of the invention provides a probe for use in a probe assembly for electrical testing, which comprises: a first arm extending generally in a fifth direction; a second arm electrically and physically connected to the first arm and extending generally in a sixth direction substantially slanted with respect to the fifth direction; a first terminal portion formed at a distal end of the first arm and comprising a first tip configured to form an electrical and physical contact with a first device, wherein the first terminal portion is configured to allow the first tip to elastically move generally in the fifth direction; and a second terminal portion formed at a distal end of the second arm and comprising a second tip configured to form an electrical and physical contact with a second device, wherein the second terminal portion is configured to allow the second tip to elastically move generally in the fifth direction.

In the foregoing probe, the second arm may have an upper surface and the probe may further comprise a projection extending from the upper surface. The second terminal portion may comprise a resilient extension between the second arm and the second tip, wherein the resilient extension may generally extend in the fifth direction.

Still another aspect of the invention provides a method of making a probe assembly for use in electrical testing of an object, the method comprising: providing a probe supporter which comprises: a probe supporter body elongated in a first direction and comprising a first side surface, a second side surface, a first facing surface and a second facing surface which generally extend in the first direction, wherein the first and second facing surfaces are substantially nonparallel to each other, a plurality of first slots formed on the first side surface and the first facing surface, and a plurality of second slots formed into the second side surface and the second facing surface; providing a first probe and a second probe; and engaging the first probe with one of the plurality of first slots and the second probe with one of the plurality of second slots.

In the foregoing method, providing the probe supporter may comprise forming the plurality of first slots using a rotating wheel cutter. In forming the plurality of first slots, the rotating wheel cutter does not contact the second facing surface.

An aspect of the present invention provides a probe and a probe assembly which are easy to fabricate and can be manufactured with reduced production cost and greatly increased productivity, and a probe card having the same.

Another aspect of the present invention is to provide a probe and a probe assembly that can save maintenance and repair cost by making it possible to readily remove probes and a supporter from a printed circuit board, and a probe card having the same.

A further aspect of the present invention is to provide a probe and a probe assembly that can easily inspect an inspection object having a fine pattern by reducing an arrangement interval of probes mounted on a supporter, and a probe card having the same.

A still further aspect of the present invention is to provide a probe and a probe assembly which are less deformable and enjoy a prolonged lifespan, and a probe card having the same.

In one aspect of the present invention, there is provided a probe card for use in testing electric characteristics of an inspection object having a plurality of electrode pads, comprising: a printed circuit board through which electric signals are transmitted to the electrode pads of the inspection object; a supporter attached to the printed circuit board, the supporter including a first side surface, a first slanting surface extending obliquely toward a center plane of the supporter from the first side surface and a plurality of first insertion slots formed across the first side surface and the first slanting surface; and a plurality of probes inserted into the first insertion slots, each of the probes including a first arm portion fitted to the first side surface, a second arm portion extending obliquely from the first arm portion so that the second arm portion can be fitted to the first slanting surface, a connection terminal portion joined to a tip end of the first arm portion so that the connection terminal portion can be connected to the printed circuit board and a contact terminal portion joined to a tip end of the second arm portion so that the contact terminal portion can be connected to each of the electrode pads of the inspection object.

In another aspect of the present invention, there is provided a probe assembly for transmitting electric signals between an inspection object and a printed circuit board, comprising: a supporter including a first side surface, a first slanting surface extending obliquely toward a center plane of the supporter from the first side surface and a plurality of first insertion slots formed across the first side surface and the first slanting surface; and a plurality of probes inserted into the first insertion slots, each of the probes including a first arm portion fitted to the first side surface, a second arm portion extending obliquely from the first arm portion so that the second arm portion can be fitted to the first slanting surface, a connection terminal portion joined to a tip end of the first arm portion so that the connection terminal portion can be connected to the printed circuit board and a contact terminal portion joined to a tip end of the second arm portion so that the contact terminal portion can be connected to the inspection object.

In a further aspect of the present invention, there is provided a probe for transmitting electric signals between an inspection object and a printed circuit board, comprising: a first arm portion; a second arm portion extending obliquely from the first arm portion; a connection terminal portion joined to a tip end of the first arm portion so that the connection terminal portion can be connected to the printed circuit board; and a contact terminal portion joined to a tip end of the second arm portion so that the contact terminal portion can be connected to the inspection object.

BRIEF DESCRIPTION OF THE DRAWINGS

The above and other aspects and features of the present invention will become apparent from the following description of embodiments, given in conjunction with the accompanying drawings, in which.

DETAILED DESCRIPTION OF EMBODIMENTS

Hereinafter, embodiments of the present invention will be described in detail with reference to the accompanying drawings.

Figure 1:
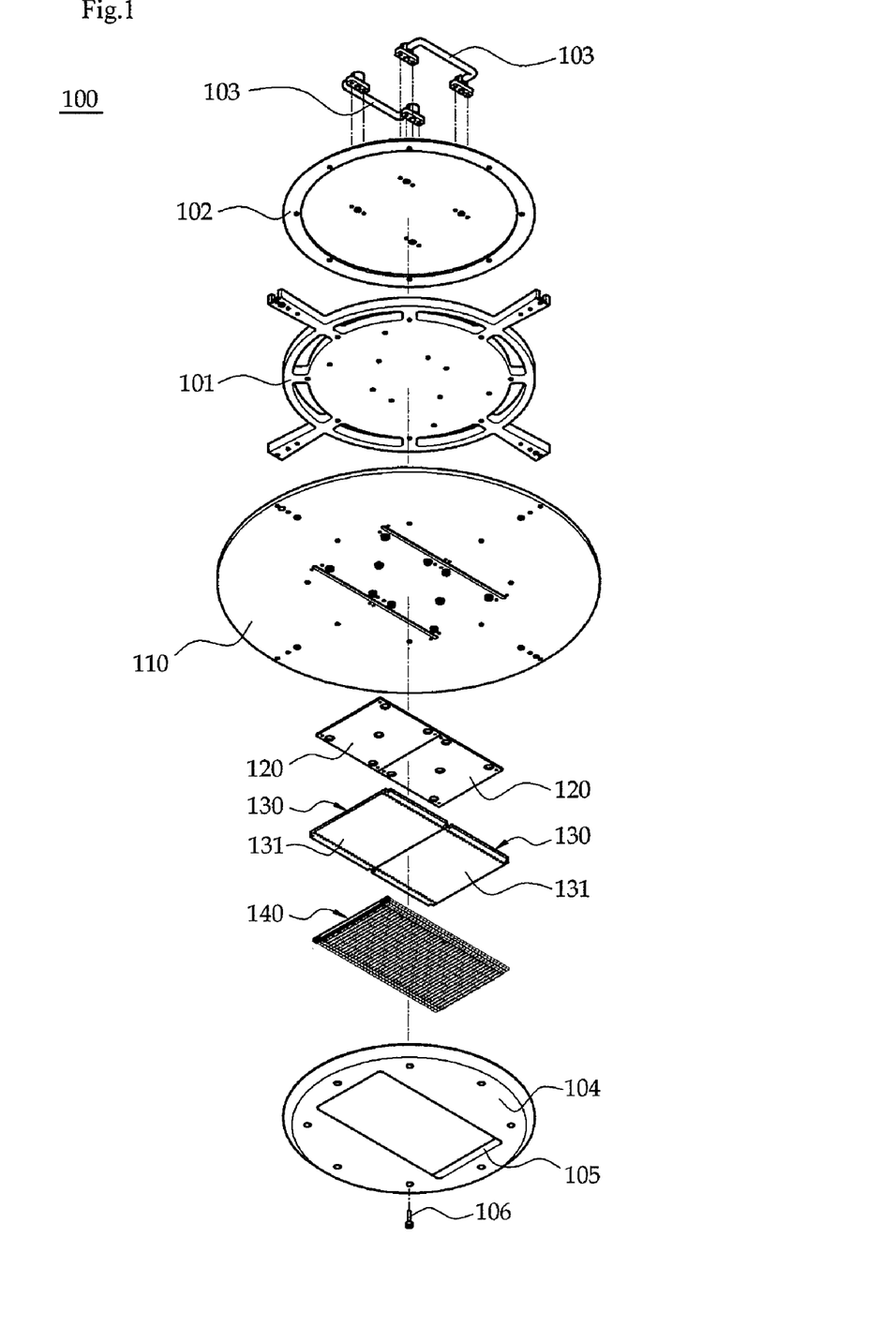
FIG. 1 is an exploded perspective view schematically showing a probe card in accordance with one embodiment of the present invention.

Referring to FIG. 1, a probe card 100 in accordance with one embodiment of the present invention includes a printed circuit board 110, a plurality of interposers 120, a plurality of space transformers 130 and a plurality of probe assemblies 140.

The printed circuit board 110 is connected to a test head of a tester (not shown) through a pogo block and a performance board unit, both of which are well-known in the art. A stiffener 101 for reinforcing the stiffness of the printed circuit board 110 is attached to the upper surface of the printed circuit board 110. A stiffener cover 102 for protecting the stiffener 101 is fixed to the upper surface of the stiffener 101 and a plurality of handles 103 is attached to the upper surface of the stiffener cover 102.

The interposers 120 are attached to the lower surface of the printed circuit board 110 so that they can be connected to the printed circuit board 110. The interposers 120 serve to transmit electric signals between the printed circuit board 110 and the probe assemblies 140 and also to maintain the planarity of the probe card 100.

The space transformers 130 are attached to the lower surfaces of the interposers 120 so that they can be connected to the interposers 120. Each of the space transformers 130 is formed of a multi-layer printed circuit board 131 having a plurality of electrode pads 132 on the lower surface thereof. The electrode pads 132 are electrically connected to the printed circuit board 110 through the interposers 120. Although the interposers 120 and the space transformers 130 are two in number in one embodiment shown in FIG. 1, the number of the interposers 120 and the space transformers 130 may be changed arbitrarily.

Figure 2:
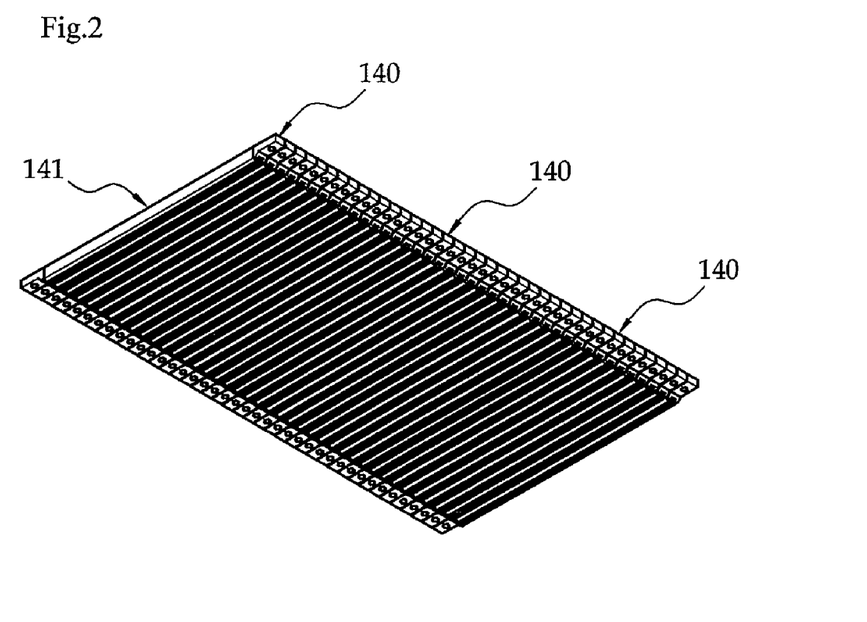
FIG. 2 is a perspective view illustrating a plurality of probe assemblies employed in the probe card in accordance with one embodiment of the present invention.
Figure 3:
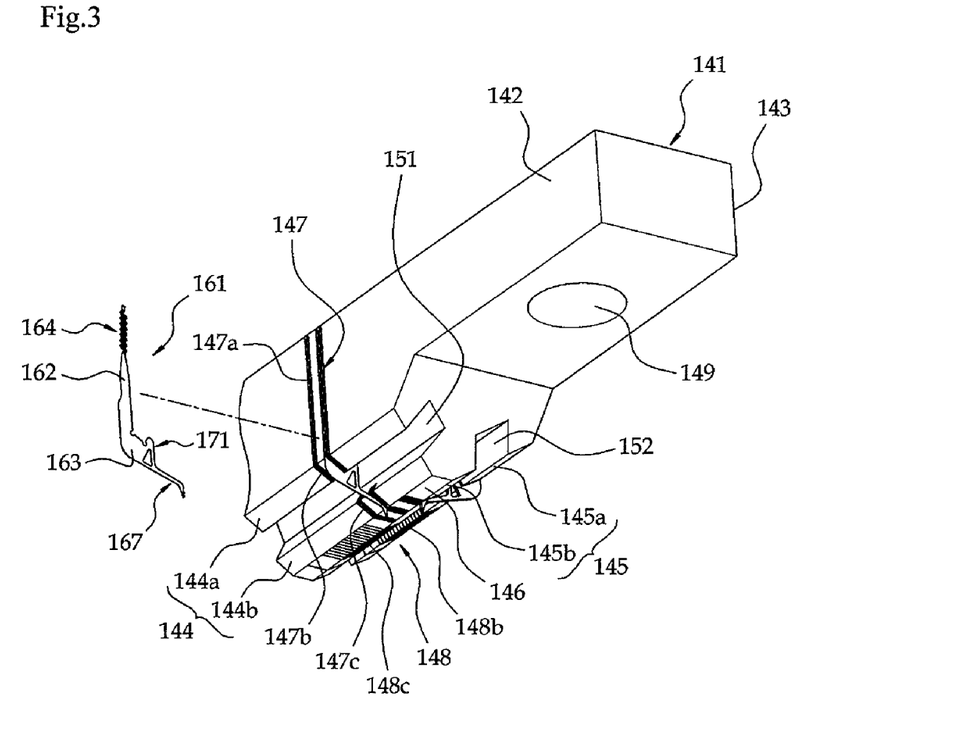
FIG. 3 is an exploded perspective view showing one of the probe assemblies shown in FIG. 2.

Referring to FIGS. 1 to 3, each of the probe assemblies 140 includes a supporter 141 attached to the lower surface of the multi-layer printed circuit board 131 and a plurality of probes 161 fixed to the opposite side surfaces of the supporter 141. The supporter 141 is made of an insulating material, e.g., a ceramic material such as zirconia ($ZrO_2$) or the like.

Figure 4:
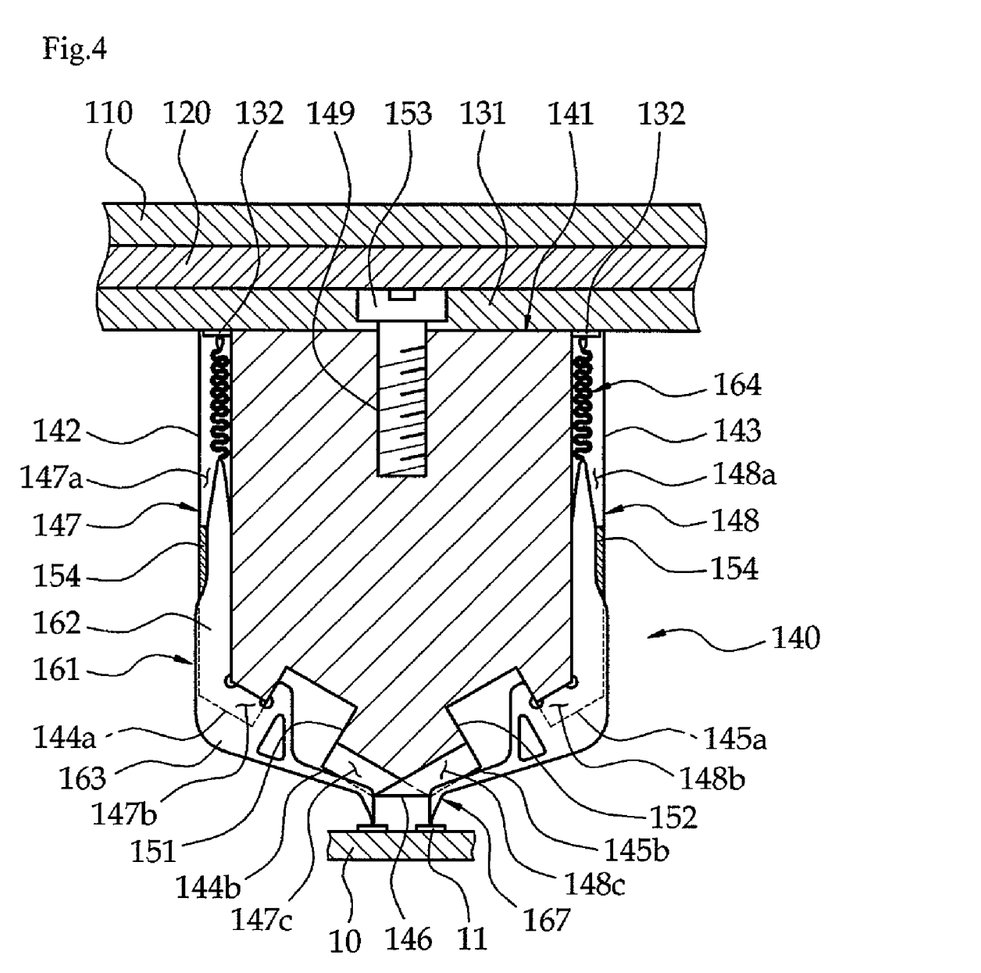
FIG. 4 is a section view illustrating the combined state of a printed circuit board, an interposer, a space transformer and a probe assembly employed in the probe card in accordance with one embodiment of the present invention.

As illustrated in FIGS. 3 and 4, the supporter 141 has first and second vertical side surfaces 142 and 143 formed on the opposite sides of the supporter 141, a horizontal lower surface 146 formed on the underside of the supporter 141 and first and second slanting surfaces 144 and 145 for joining the first and second side surfaces 142 and 143 to the lower surface 146. The first and second side surfaces 142 and 143 extend in a parallel relationship with each other. The first slanting surface 144 is formed between the first side surface 142 and the lower surface 146 and extends obliquely toward a center plane of the supporter 141 from the first side surface 142. Similarly, the second slanting surface 145 is formed between the second side surface 143 and the lower surface 146 and extends obliquely toward a center plane of the supporter 141 from the second side surface 143. A first channel 151 is formed in the middle region of the first slanting surface 144 to extend in a longitudinal direction. Likewise, a second channel 152 is formed in the middle region of the second slanting surface 145 to extend in the longitudinal direction. The first slanting surface 144 is divided by the first channel 151 into a first surface portion 144a (a first facing surface) joined to the first side surface 142 and a second surface portion 144b (an additional facing surface) joined to the lower surface 146. Similarly, the second slanting surface 145 is divided by the second channel 152 into a first surface portion 145a joined to the second side surface 143 and a second surface portion 145b joined to the lower surface 146.

The supporter 141 has a plurality of first and second insertion slots 147 and 148 into which the probes 161 of a thin plate type are inserted. The first insertion slots 147 are formed on the first side surface 142 and the first slanting surface 144. The second insertion slots 148 are formed on the second side surface 143 and the second slanting surface 145. Each of the first insertion slots 147 consists of a first slot portion 147a formed on the first side surface 142, a second slot portion 147b formed on the first surface portion 144a of the first slanting surface 144 and a third slot portion 147c formed on the second surface portion 144b of the first slanting surface 144. The first, second and third slot portions 147a, 147b and 147c lie on one and the same cross-sectional plane. Each of the second insertion slots 148 consists of a first slot portion 148a formed on the second side surface 143, a second slot portion 148b formed on the first surface portion 145a of the second slanting surface 145 and a third slot portion 148c formed on the second surface portion 145b of the second slanting surface 145. The first, second and third slot portions 148a, 148b and 148c lie on the same cross-sectional plane. The first insertion slots 147 and the second insertion slots 148 lie on the same cross-sectional plane in a symmetrical relationship. Alternatively, the first insertion slots 147 and the second insertion slots 148 may lie on different cross-sectional planes.

The first insertion slots 147 and the second insertion slots 148 are formed to extend across the lower surface 146 of the supporter 141. This means that the first insertion slots 147 and the second insertion slots 148 are met with each other on the lower surface 146. Needless to say, the first insertion slots 147 and the second insertion slots 148 are not met with each other on the first slanting surface 144 or the second slanting surface 145.

The supporter 141 is screw-fixed to the lower surface of the multi-layer printed circuit board 131. For this purpose, a pair of thread holes 149 is formed in the opposite end portions of the supporter 141. As can be seen in FIG. 4, the supporter 141 is fixed to the lower surface of the multi-layer printed circuit board 131 by driving a screw 153 into the corresponding one of the thread hole 149 through the multi-layer printed circuit board 131. Although the supporter 141 is of an elongated bar shape in the illustrated embodiment, the width and length of the supporter 141 may be arbitrarily changed if such a need arises. For example, the supporter 141 may have a block shape or other shapes rather than the elongated bar shape.

The thin plate type probes 161 are fitted to the first and second insertion slots 147 and 148 of the supporter 141. As shown in FIG. 4, each of the probes 161 is designed to make contact with an electrode pad 132 of the multi-layer printed circuit board 131 at one end and with an electrode pad 11 of an inspection object 10 such as a wafer, a flat display or the like at the other end. Electric signals are transmitted between the multi-layer printed circuit board 131 and the inspection object 10 through the probes 161. Each of the probes 161 includes a first arm portion 162, a second arm portion 163, a connection terminal portion 164 and a contact terminal portion 167. The second arm portion 163 extends obliquely from the first arm portion 162 in a downward direction.

Figure 5:
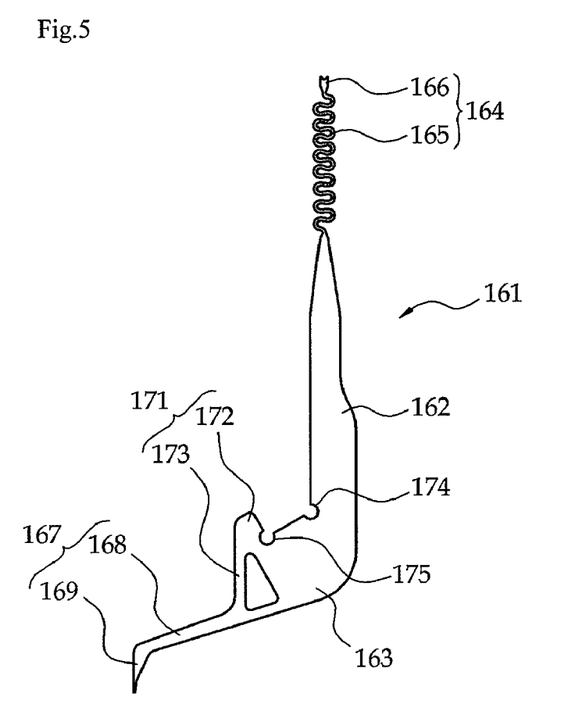
FIG. 5 is a front view schematically illustrating a probe of a probe assembly in accordance with one embodiment of the present invention.

As illustrated in FIG. 5, the connection terminal portion 164 is joined to the upper end of the first arm portion 162 so that it can be connected to the electrode pad 132 of the multi-layer printed circuit board 131. The connection terminal portion 164 is formed of an elastically deformable spring portion 165 and a first terminal 166. The spring portion 165 is connected to the upper end of the first arm portion 162 and is formed into a meandering shape so that it can be elastically deformed when compressed or pulled. The first terminal 166 is joined to the upper end of the spring portion 165 and is connected to the electrode pad 132 of the multi-layer printed circuit board 131. In one embodiment of the present invention, the connection terminal portion 164 of each of the probes 161 may have many different shapes.

Figure 6A:
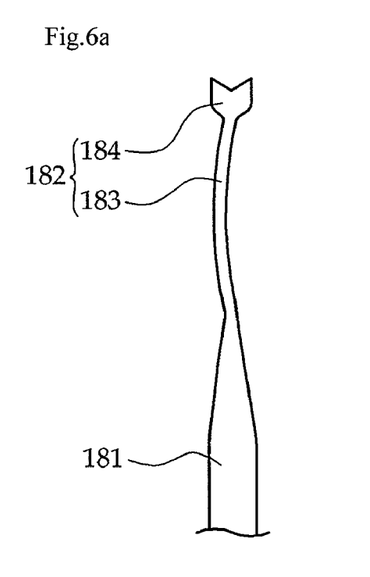
FIGS. 6A and 6B are front views showing variants of a connection terminal portion employed in the probe of the probe assembly in accordance with one embodiment of the present invention.

FIGS. 6A and 6B show variants of the connection terminal portion. A connection terminal portion 182 shown in FIG. 6A is joined to the upper end of a first arm portion 181. The connection terminal portion 182 includes a pre-stressed and elongated spring portion 183 having a gently curved shape, and a first terminal 184 joined to the upper end of the spring portion 183. The spring portion 183 is of a pre-stressed bending beam structure and has relatively high flexural stiffness, i.e., increased elastic strain and durability. Therefore, the spring portion 183 is prevented from being plastically deformed even when the first terminal 184 makes contact with the electrode pad 132 of the multi-layer printed circuit board 131 (see FIG. 4) and receives a vertical load. When the first terminal 184 is connected to the electrode 132, the spring portion 183 undergoes elastic deformation to thereby increase the contact area between the first terminal 184 and the electrode pad 132. This makes it possible to assure stable connection between the first terminal 184 and the electrode pad 132.

Figure 6B:
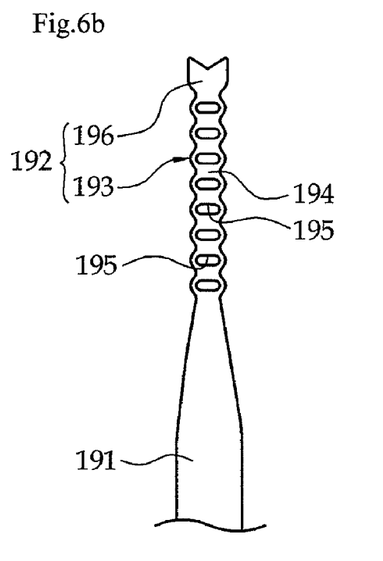

A connection terminal portion 192 shown in FIG. 6B is formed of a spring band 193 and a first terminal 196. The spring band 193 has a band portion 194 joined to the upper end of a first arm portion 191 and a plurality of holes 195 formed along the length of the band portion 194 at an equal interval. The opposite side surfaces of the band portion 194 are formed into an undulating shape to permit elastic deformation of the band portion 194. If the first terminal 196 makes contact with the electrode pad 132 of the multi-layer printed circuit board 131 (see FIG. 4) and receives a vertical load, the spring band 193 is compressed and elastically deformed. The first terminal 196 is maintained in close contact with the electrode pad 132 by the biasing force of the spring band 193.

Referring again to FIGS. 4 and 5, the contact terminal portion 167 of each of the probes 161 includes an elastic bar 168 and a second terminal 169. The elastic bar 168 extends in an elongated shape from the tip end of the second arm portion 163 so that it can be elastically deformed. The second terminal 169 is formed in the tip end of the elastic bar 168 and is designed to make contact with the electrode pad 11 of the inspection object 10.

Each of the probes 161 includes a reinforcing portion 171 that reinforces the stiffness of the elastic bar 168. The reinforcing portion 171 is formed of an extension portion 172 and a connection portion 173. The extension portion 172 extends upwardly from the upper edge of the second arm portion 163. The connection portion 173 serves to interconnect the intermediate portion of the elastic bar 168 and the upper surface of the extension portion 172. The elastic bar 168, the extension portion 172 and the connection portion 173 make a triangle when they are viewed from the front. As can be seen in FIG. 4, the reinforcing portion 171 of each of the probes 161 is positioned in the first channel 151 or the second channel 152 of the supporter 141.

In addition, each of the probes 161 has a first recess 174 and a second recess 175. The first recess 174 is formed in an inner corner where the first arm portion 162 and the second arm portion 163 are met with each other. The second recess 175 is formed in an inner corner where the second arm portion 163 and the extension portion 172 are met with each other. Provision of the first and second recesses 174 and 175 in each of the probes 161 helps restrain stresses from being concentrated on the corner where the first arm portion 162 and the second arm portion 163 are met with each other and the corner where the second arm portion 163 and the extension portion 172 are met with each other. Otherwise, the stress concentration may occur in the manufacturing process of the probes 161. Furthermore, the first and second recesses 174 and 175 serve to ensure that the probes 161 are accurately fitted to the supporter 141 even if a machining error exists in the supporter 141 or even when an assembly error is present between the supporter 141 and the probes 161.

As can be seen in FIG. 4, during the process of inserting the probes 161 into the first insertion slots 147 of the supporter 141, the outer corner where the first side surface 142 and the first slanting surface 144 are met with each other is received in the first recess 174, and the outer corner where the first surface portion 144a of the first slanting surface 144 and the first channel 151 are met with each other is received in the second recess 175. This makes it possible to accurately insert the probes 161 into the first insertion slots 147. Similarly, during the course of inserting the probes 161 into the second insertion slots 148 of the supporter 141, the outer corner where the second side surface 143 and the second slanting surface 145 are met with each other is received in the first recess 174, and the outer corner where the first surface portion 145a of the second slanting surface 145 and the first channel 151 are met with each other is received in the second recess 175. This makes it possible to accurately insert the probes 161 into the second insertion slots 148.

The probes 161 configured as above are firmly fixed to the supporter 141 by means of an insulating resin material 154 such as epoxy resin or the like, after they have been inserted into the first and second insertion slots 147 and 148 of the supporter 141. The probe assemblies 140, each of which includes the supporter 141 and the probes 161, are attached to the lower surface of the multi-layer printed circuit board 131. For the purpose of protecting the probe assemblies 140 attached to the lower surface of the multi-layer printed circuit board 131, a cover 104 is fixed to the lower surface of the printed circuit board 110 by a plurality of screws 105 as shown in FIG. 1. An opening 105 for receiving the probe assemblies 140 is formed in the central region of the cover 104.

Description will now be made on a process of manufacturing the probe card in accordance with one embodiment of the present invention.

Figure 7:
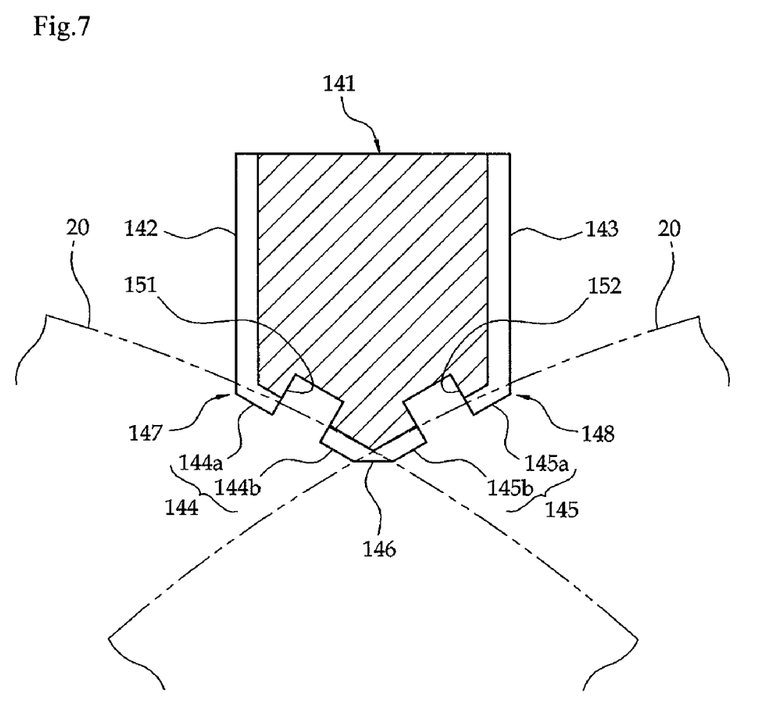
FIG. 7 is a section view depicting a process by which insertion slots are formed in a supporter of the probe assembly in accordance with one embodiment of the present invention.

First, each of the probe assemblies 140 is produced by forming the first and second insertion slots 147 and 148 in the supporter 141 and fitting the probes 161 into the first and second insertion slots 147 and 148. Referring to FIG. 7, the first and second insertion slots 147 and 148 are cut on the left and right sides of the supporter 141 by means of a wheel cutter 20 having a specified diameter (e.g., a diameter of 55.4 mm) at an equal or unequal interval. In this cutting process, the first insertion slots 147 are first cut on the first side surface 142 and the first slanting surface 144, after which the second insertion slots 148 are cut on the second side surface 143 and the second slanting surface 145.

During the process of cutting the first and second insertion slots 147 and 148 on the first and second slanting surfaces 144 and 145, the first and second insertion slots 147 and 148 may be formed to extend to the lower surface 146 of the supporter 141. In this case, the first and second insertion slots 147 and 148 may be overlapped with each other on the lower surface 146. The overlapping occurs only in the lower surface 146. During the course of cutting the second insertion slots 148, the wheel cutter 20 does not meet with the first insertion slots 147 previously formed on the first side surface 142 and the first slanting surface 144. Therefore, it is possible to form the first and second insertion slots 147 and 148 on the left and right sides of the supporter 141 at a narrow interval with no likelihood of mutual interference.

An insulating resin 154 is applied to the first and second insertion slots 147 and 148 formed in the supporter 141. Then, the probes 161 are fitted into the first and second insertion slots 147 and 148 as illustrated in FIGS. 3 and 4, thereby completing a fabrication process of one of the probe assemblies 140. At this time, the first arm portion 162 of each of the probes 161 is inserted into the first slot portion 147a of each of the first insertion slots 147. The second arm portion 163 is inserted into the second slot portion 147b and the contact terminal portion 167 is inserted into the third slot portion 147c. The reinforcing portion 171 is positioned in the first channel 151. Similarly, the first arm portion 162 of each of the probes 161 is inserted into the first slot portion 148a of each of the second insertion slots 148. The second arm portion 163 is inserted into the second slot portion 148b and the contact terminal portion 167 is inserted into the third slot portion 148c. The reinforcing portion 171 is positioned in the second channel 152.

If the insulating resin 154 is completely cured after the probes 161 have been inserted into the first and second insertion slots 147 and 148, the probes 161 are firmly fixed to the supporter 141 by the insulating resin 154. In this manner, the probes 161 are inserted into the first and second insertion slots 147 and 148 formed at a narrow interval, whereby the arrangement interval of the probes 161 becomes narrow. This enables the probe assemblies 140 according to one embodiment of the present invention to test the inspection object 10 having a fine pattern.

The insulating resin 154 for fixing the probes 161 to the supporter 141 in the fabricating process of the probe assemblies 140 may be applied to the probes 161 and not to the first and second insertion slots 147 and 148. In other words, the insulating resin 154 may be applied to the first and second arm portions 162 and 163 of the probes 161 prior to inserting the probes 161 into the insertion slots 147 and 148. This also makes it possible to firmly fix the probes 161 to the supporter 141.

The probe assembly 140 thus fabricated is fixed to the lower surface of the multi-layer printed circuit board 131 by tightening the screws 153 into the thread holes 149 of the supporter 141 through the multi-layer printed circuit board 131. At this time, the connection terminal portions 164 of the probes 161 are brought into contact with the electrode pads 132 of the multi-layer printed circuit board 131. If the first terminal 166 of each of the connection terminal portions 164 receives a vertical load by making contact with each of the electrode pads 132, the spring portion 165 is elastically deformed so that the first terminal 166 can remain in close contact with each of the electrode pads 132 by means of the biasing force of the spring portion 165.

After the probe assemblies 140 have been fixed to the lower surface of the multi-layer printed circuit board 131, the multi-layer printed circuit boards 131 are mounted to the interposers 120 attached to the lower surface of the printed circuit board 110. Then, the cover for protecting the probe assemblies 140 is attached to the printed circuit board 110. The stiffener 101 and the stiffener cover 102 are fixed to the upper surface of the printed circuit board 110 one above the other, thereby terminating the fabrication of the probe card 100.

Next, description will be made on how to test the inspection object with the probe card in accordance with one embodiment of the present invention.

The probe card 100 in accordance with one embodiment of the present invention is installed on and connected to a test head. As the test head comes into operation, the second terminal 169 of each of the probes 161 makes contact with each of the electrode pads 11 of the inspection object 10 as illustrated in FIG. 4. If the second terminal 169 of each of the probes 161 receives a vertical load by coming into contact with each of the electrode pads 11, the elastic bar 168 is elastically deformed to ensure that the second terminal 169 remains in close contact with each of the electrode pads 11 of the inspection object 10. At this time, the connection portion 173 of the reinforcing portion 171 supports the intermediate portion of the elastic bar 168 to prevent the elastic bar 168 from undergoing plastic deformation. This helps increase the lifespan and reliability of the probes 161.

The elastic bar 168 of each of the probes 161 is inserted into and held in place by the third slot portion 147c of each of the first insertion slots 147 and the third slot portion 148c of each of the second insertion slots 148. For this reason, the elastic bar 168 is less likely to undergo flexural deformation in a transverse direction of the third slot portion 147c or 148c. This ensures that the second terminal 169 makes accurate contact with each of the electrode pads 11 of the inspection object 10, thereby greatly improving the reliability and repeatability of the test for the inspection object 10.

Once the second terminals 169 of the probes 161 come into contact with the electrode pads 11 of the inspection object 10, electric signals are transmitted between the printed circuit board 110 and the inspection object 10 via the interposers 120, the multi-layer printed circuit boards 131 and the probe assemblies 140. In case the probes 161 are arranged with an increased density, the multi-layer printed circuit board 131 makes it easy for the inter-layer conductor circuit to interconnect the probes 161 and the printed circuit board 110. Furthermore, the probe assemblies 140 can be arranged at a high density using a plurality of the interposers 120 and a plurality of the space transformers 130. Therefore, the probe card 100 in accordance with one embodiment of the present invention is capable of inspecting a single sheet of wafer having a diameter of 200 mm or 300 mm by performing only one or two touchdown operation. This makes it possible to greatly increase the inspection speed of the inspection object 10.

With the probe card 100 in accordance with one embodiment of the present invention, the spring portions 165 of the probes 161 are elastically deformed to ensure that tight physical contact is maintained between the electrode pads 132 of the multi-layer printed circuit board 131 and the first terminals 166 of the probes 161. This eliminates the need to solder the electrode pads 132 and the first terminals 166, thus greatly improving the productivity and reliability of the probe card 100 as compared to the prior art.

With the probe card 100 in accordance with one embodiment of the present invention, the probes 161 are fixed in place in a state that they are inserted into the first and second insertion slots 147 and 148 of the supporter 141. This eliminates the need to use a jig which would otherwise be used in the prior art for fitting the probes 161 to the supporter 141. Therefore, it is possible to fabricate the probe assemblies 140 with ease, which in turn greatly improves the productivity of the probe card 100.

The probe card 100 in accordance with one embodiment of the present invention is of a structure in which the probes 161 are inserted into the first and second insertion slots 147 and 148 of the insulating supporter 141. This eliminates the need to coat the probes 161 with an insulating material, which assists in saving production costs and improving productivity.

With the probe card 100 in accordance with one embodiment of the present invention, if an abnormality occurs in one of the probe assemblies 140, it is possible to remove only the abnormal one and replace it with a new one in a simple manner. This makes it possible to sharply reduce the costs involved in maintenance and repair.

Figure 8:
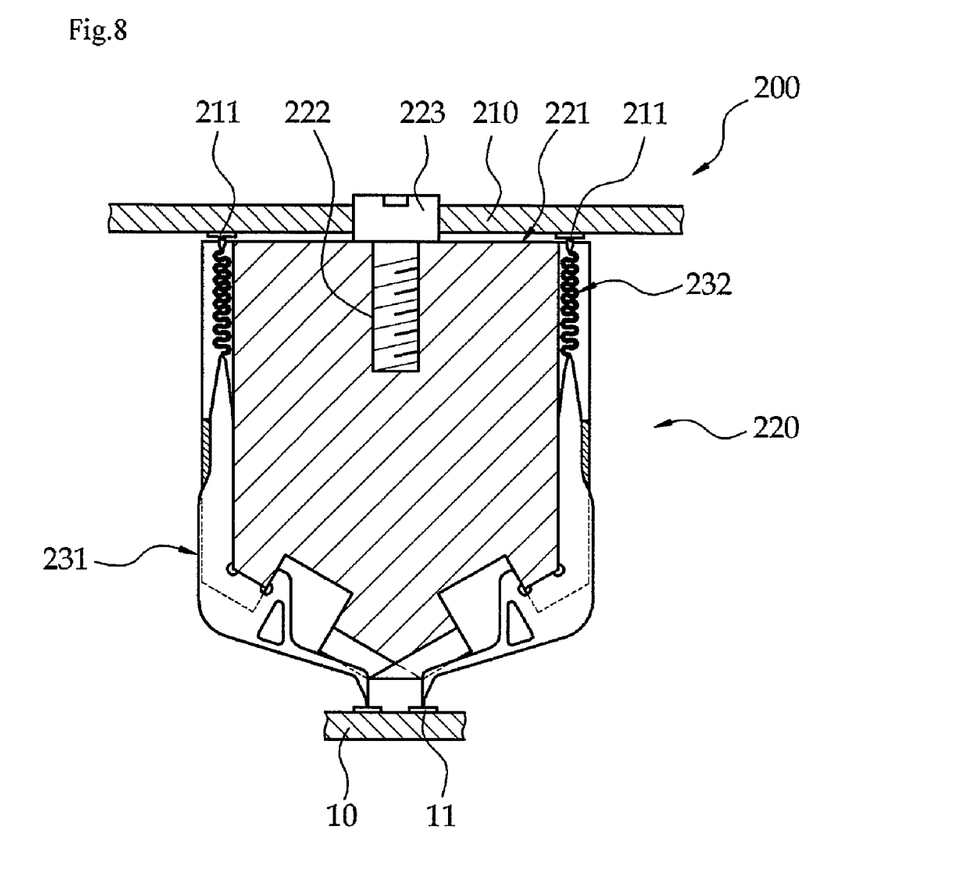
FIG. 8 is a section view schematically showing a part of a probe card in accordance with one embodiment of the present invention.

FIG. 8 is a section view schematically showing a part of a probe card in accordance with one embodiment of the present invention. The probe card 200 shown in FIG. 8 is the same in most configurations as the probe card 100 of the preceding embodiment, except that probe assemblies 220 are directly coupled to a printed circuit board 210 with no intervention of the interposers 120 (see FIG. 1) and the space transformers 130 (see FIG. 1). The printed circuit board 210 is provided with a plurality of electrode pads 211. The probes 231 of the probe assemblies 220 have connection terminal portions 232 connected to electrode pads 211 of the printed circuit board 210. Each of the probe assemblies 140 is fixed to the printed circuit board 210 by driving screws 223 into thread holes 222 of a supporter 221 through the printed circuit board 210. The remaining configurations including the probe assemblies 140 are the same as those of the preceding embodiment and, therefore, no description will be made in that regard.

Figure 9A:
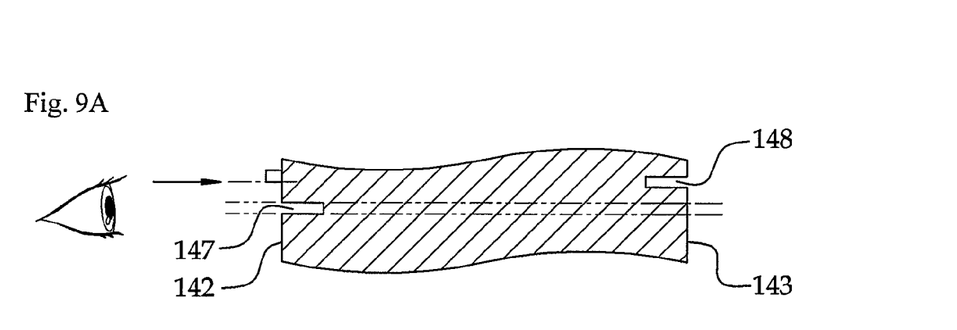
FIGS. 9a, 9b and 9c are sectional views showing positional relationship between two slots.
Figure 9B:
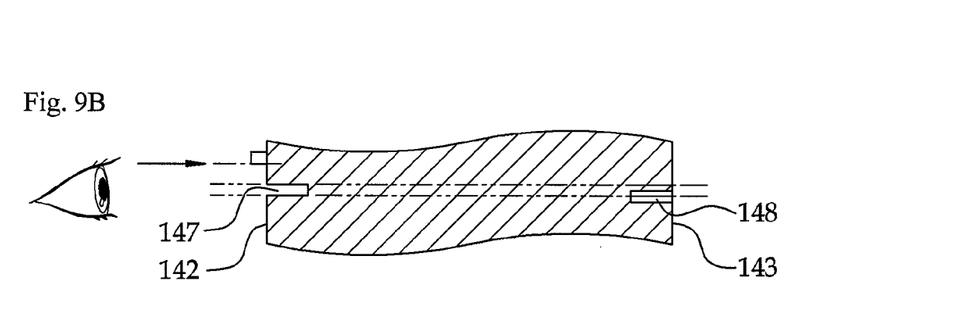
Figure 9C:
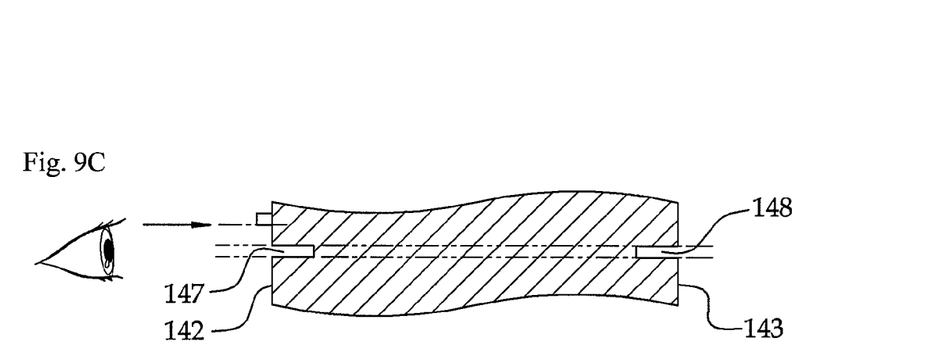

Referring to FIG. 9a, in one embodiment, the probe assembly comprises one of the plurality of first slots 147 which does not overlap any one of the plurality of second slots 148 when viewed in a direction perpendicular to the first side surface 142. Referring to FIG. 9b, in one embodiment, the probe assembly comprises one of the plurality of first slots 147, which has a width that partially overlaps with a width of one of the plurality of second slots 148 when viewed in a direction perpendicular to the first side surface 142. Referring to FIG. 9c, in one embodiment, the probe assembly comprises one of the plurality of first slots 147 that substantially eclipses one of the plurality of second slots 148 when viewed in a direction perpendicular to the first side surface 142.

As described above, the probe card in accordance with one embodiment the present invention includes a plurality of probes arranged at a high density. This helps reduce the frequency of touchdown operations performed during the course of inspecting an inspection object, thereby greatly increasing the inspecting speed of the inspection object.

Furthermore, the probe card in accordance with one embodiment the present invention is of a structure in which probes are inserted into insertion slots of an insulating supporter. Therefore, the probe card can be fabricated with ease and increased accuracy. It is also possible to manufacture the probe card with reduced production cost and greatly increased productivity.

Moreover, the probe card in accordance with one embodiment the present invention is formed of individual probe assemblies that can be separated from a printed circuit board on a one-by-one basis. This makes it easy to replace a defective probe or a defective probe assembly, consequently reducing the costs involved in maintenance and repair.

In addition, the probe card in accordance with one embodiment the present invention allows probes to be accurately connected to an inspection object and a printed circuit board with no likelihood of plastic deformation. Thus, the probe card can enjoy increased reliability and prolonged lifespan.

The present invention is not limited to the embodiments shown and described hereinabove. It will be understood by those skilled in the art that various changes and modifications may be made without departing from the scope of the invention defined in the claims.

What is claimed is:

1. A probe assembly for use in electrical testing of an object, the probe assembly comprising:
   a plurality of probes;
   a probe supporter body elongated in a first direction and comprising a first side surface, a second side surface, a first facing surface and a second facing surface, wherein the first and second facing surfaces are configured to face a testing object, wherein the first and second facing surfaces are substantially nonparallel to each other;
   a plurality of first slots formed on the first side surface and the first facing surface, wherein each first slot is configured to receive a portion of one of the plurality of probes;
   a plurality of second slots formed on the second side surface and the second facing surface, wherein each second slot is configured to receive a portion of one of the plurality of probes; and
   a channel generally extending in the first direction and disposed between the first facing surface and the second facing surface,
   wherein a first one of the plurality of probes is engaged with one of the plurality of first slots, wherein the first probe comprises a projection projecting into the channel and further configured to limit the first probe's movement in a direction perpendicular to the first side surface.

2. The probe assembly of claim 1, wherein the probe supporter body has a cross-section having a generally gable shape.

3. The probe assembly of claim 1, wherein the first facing surface and the first side surface form a first angle therebetween, wherein the second facing surface and the second side surface form a second angle therebetween, and wherein the first and second angle are about the same.

4. The probe assembly of claim 1, wherein each first slot comprises a portion extending in a second direction that is substantially perpendicular to the first direction, wherein each second slot comprises a portion extending in the second direction.

5. The probe assembly of claim 4, wherein each first slot comprises a portion extending in a third direction that is substantially perpendicular to the first direction and substantially slanted relative to the second direction, wherein each second slot comprises a portion extending in a fourth direction that is substantially perpendicular to the first direction and substantially slanted relative to the second direction, wherein the third direction is not parallel to the fourth direction.

6. The probe assembly of claim 1, wherein the probe assembly comprises one of the plurality of first slots which does not overlap any one of the plurality of second slots when viewed in a direction perpendicular to the first side surface.

7. The probe assembly of claim 1, wherein the probe assembly comprises one of the plurality of first slots, which has a width that partially overlaps with a width of one of the plurality of second slots when viewed in a direction perpendicular to the first side surface.

8. The probe assembly of claim 1, wherein the probe assembly comprises one of the plurality of first slots that substantially eclipses one of the plurality of second slots when viewed in a direction perpendicular to the first side surface.

9. The probe assembly of claim 1, wherein the first and second side surfaces are substantially parallel to each other.

10. The probe assembly of claim 9, wherein the first facing surface is substantially slanted with respect to the first side surface.

11. The probe assembly of claim 1, wherein a second one of the plurality of probes is engaged with one of the plurality of second slots.

12. The probe assembly of claim 1, wherein the first probe comprises:
 a first arm generally extending in a second direction perpendicular to the first direction, wherein a portion of the first arm is inserted in the one of the plurality of first slots,
 a second arm electrically and physically connected to the first arm and generally extending in a third direction substantially perpendicular to the first direction and substantially slanted with respect to the second direction, wherein a portion of the second arm is inserted in the one of the plurality of first slots,
 a first terminal portion formed at a distal end of the first arm and comprising a first tip configured to contact a first electrode, and
 a second terminal portion formed at a distal end of the second arm and comprising a second tip configured to contact a second electrode.

13. The probe assembly of claim 1, further comprising
 an additional facing surface which is substantially parallel to the first facing surface, wherein the channel is located between the first facing surface and the additional facing surface, and
 an additional slot formed on the additional facing surface configured to receive a portion of the first probe.

* * * * *